United States Patent
Yoon et al.

(10) Patent No.: US 9,445,518 B2
(45) Date of Patent: Sep. 13, 2016

(54) DISPLAY DEVICE AND APPARATUS FOR SIDE SURFACE SEALING OF DISPLAY PANEL

(71) Applicant: LG DISPLAY CO., LTD., Seoul (KR)

(72) Inventors: Yong Joong Yoon, Paju-si (KR); Taewoo Kim, Paju-si (KR); Mijin Han, Goyang-si (KR); Daeyun Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 405 days.

(21) Appl. No.: 13/933,876

(22) Filed: Jul. 2, 2013

(65) Prior Publication Data

US 2014/0160694 A1    Jun. 12, 2014

(30) Foreign Application Priority Data

Dec. 11, 2012  (KR) .................. 10-2012-0143286

(51) Int. Cl.
*H05K 5/00* (2006.01)
*H05K 5/06* (2006.01)
(Continued)

(52) U.S. Cl.
CPC ............... *H05K 5/06* (2013.01); *G02F 1/1303* (2013.01); *G02F 1/1339* (2013.01);
(Continued)

(58) Field of Classification Search
CPC ...... H05K 5/0017; H05K 5/06; H05K 13/00; G02F 1/13; G02F 1/1303; G02F 1/1333; G02F 1/1339; G02F 1/1345; G02F 1/1349; G02F 2202/28; G02F 2001/133311
USPC ............ 361/679.04–679.07, 679.21, 679.22, 361/749, 752, 760; 345/87, 204; 349/58, 349/59, 62; 359/462
See application file for complete search history.

(56) References Cited

U.S. PATENT DOCUMENTS 5,986,726 A * 11/1999 Murai ............... G02F 1/133308
                                                    349/58
6,049,094 A    4/2000 Penry
(Continued)

FOREIGN PATENT DOCUMENTS

CN    101738758 A    6/2010
CN    102157110 A    8/2011
(Continued)

OTHER PUBLICATIONS

Office Action dated Aug. 28, 2015 for corresponding Taiwanese Patent Application No. 10421161780, 5 pages.
(Continued)

*Primary Examiner* — Courtney Smith
*Assistant Examiner* — Zhengfu Feng
(74) *Attorney, Agent, or Firm* — Brinks Gilson & Lione

(57) ABSTRACT

Disclosed is a display device and an apparatus for side surface sealing of display panel, which enable to realize thin profile and good exterior appearance in device, wherein the display device includes a display panel including a first substrate with pad regions, a second substrate bonded to remaining portions of the first substrate except the pad regions, and an upper polarizing film attached to an entire upper surface of the second substrate; a panel support member joined to an edge of a lower surface of the display panel; a panel driving part including a flexible circuit film attached to the pad regions; and a side surface sealing member for covering each side surface of the display panel, the flexible circuit film, the plurality of pad regions, and each side surface of the upper polarizing film.

10 Claims, 8 Drawing Sheets

(51) Int. Cl.
*H05K 13/00* (2006.01)
*G02F 1/13* (2006.01)
*G02F 1/1339* (2006.01)
*G02F 1/1345* (2006.01)
*G02F 1/1333* (2006.01)

(52) U.S. Cl.
CPC ............ *H05K 5/0017* (2013.01); *H05K 13/00* (2013.01); *G02F 1/13452* (2013.01); *G02F 2001/133311* (2013.01); *G02F 2001/133325* (2013.01); *G02F 2202/28* (2013.01)

(56) References Cited

U.S. PATENT DOCUMENTS

| | | | |
|---|---|---|---|
| 6,204,906 B1* | 3/2001 | Tannas, Jr. | ............ G02F 1/1339 349/153 |
| 6,611,302 B1* | 8/2003 | Ueda | ................. G02F 1/133308 349/58 |
| 2007/0194690 A1 | 8/2007 | Lee | |
| 2007/0196949 A1 | 8/2007 | Lee | |
| 2008/0007672 A1* | 1/2008 | Kurihara | ............. G02B 6/0025 349/65 |
| 2010/0039605 A1 | 2/2010 | Zhao et al. | |
| 2010/0123850 A1 | 5/2010 | Miyashita | |
| 2011/0227867 A1* | 9/2011 | Ogawa | .................... G06F 3/041 345/174 |
| 2011/0228197 A1* | 9/2011 | Hiranobu | ............ G02F 1/13452 349/62 |
| 2011/0236643 A1 | 9/2011 | Tsubouchi et al. | |
| 2012/0120364 A1* | 5/2012 | Wu | ........................ G02F 1/1339 349/153 |
| 2012/0264345 A1* | 10/2012 | Yoon | ..................... G02F 1/1303 445/25 |
| 2012/0307430 A1* | 12/2012 | Lee | ................... G02F 1/133308 361/679.01 |
| 2013/0076704 A1* | 3/2013 | Song | ..................... G02B 27/26 345/204 |
| 2013/0293804 A1 | 11/2013 | Kim | |

FOREIGN PATENT DOCUMENTS

| | | |
|---|---|---|
| CN | 102224445 A | 10/2011 |
| EP | 2660649 A1 | 11/2013 |
| JP | 2003-84296 A | 3/2003 |
| JP | 2005-17961 A | 1/2005 |
| JP | 2005-339897 A | 12/2005 |
| JP | 2006/276623 A | 10/2006 |
| KR | 1020120126993 A | 11/2012 |
| TW | I328273 B | 8/2010 |

OTHER PUBLICATIONS

Office Action dated Dec. 4, 2015 for corresponding Chinese Patent Application No. 201310365365.X, 10 pages.

Search Report dated Nov. 24, 2015 for corresponding Chinese Patent Application No. 201310365365.X, 4 pages.

\* cited by examiner

DISPLAY DEVICE AND APPARATUS FOR SIDE SURFACE SEALING OF DISPLAY PANEL

CROSS REFERENCE TO RELATED APPLICATIONS

This application claims the benefit of priority to Korean Patent Application No. 10-2012-0143286 filed on Dec. 11, 2012, which is hereby incorporated by reference as if fully set forth herein.

BACKGROUND

1. Field of the Disclosure

Embodiments of the present invention relate to a display device, and more particularly, to a display device and an apparatus for side surface sealing of display panel (a side surface sealing apparatus for display panel), which enable to realize thin profile and good exterior appearance in device by exposing an upper surface and each side surface of the display panel to the external.

2. Discussion of the Related Art

Various display devices, which substitute for CRT (Cathode Ray Tube) manufactured in an early stage of display device, have been researched and studied, for example, liquid crystal display device, plasma display panel, organic light emitting display device, and etc.

These display devices enable to achieve large size by decreasing weight and volume. Also, these display devices have been highly developed in various aspects such as response speed and picture quality through the continuous study. In addition to the research and development in technical aspects, design aspects of a product that can appeal to consumers have been actively researched and studied.

However, the related art display device obtained up to now has limitations in minimization of thickness and improvement of exterior appearance due to its structural properties. Hereinafter, limitations of the related art display device will be described in detail.

FIG. 1 is a cross sectional view of the related art display device.

As shown in FIG. 1, the related art display device includes a display panel 10, a panel driving part 20, a front case 30, and a front cover 40.

The display panel 10 includes a lower substrate 12, an upper substrate 14, a lower polarizing film 12a, and an upper polarizing film 14a.

On the lower substrate 12, there are gate and data lines crossing each other to define a pixel region. At a crossing portion of the gate and data lines, there is a thin film transistor. Also, a pixel electrode connected with the thin film transistor is formed in the pixel region. At one peripheral region of the lower substrate 12, a pad region is exposed to the external so that the pad region is connected with the panel driving part 20 for applying signals to the gate and data lines.

A size of the upper substrate 14 is relatively smaller than a size of the lower substrate 12. Thus, the upper substrate 14 is bonded to the remaining portions of the lower substrate 12 except the pad region of the lower substrate 12.

The lower polarizing film 12a is attached to a lower surface of the lower substrate 12, and the lower polarizing film 12a polarizes light irradiated on the lower substrate 12.

The upper polarizing film 14a is attached to an upper surface of the upper substrate 14, and the upper polarizing film 14a polarizes light emitted to the external. Generally, a polarizing axis of the lower polarizing film 12a is perpendicular to a polarizing axis of the upper polarizing film 14a.

The panel driving part 20 is connected with the externally-exposed pad region of the lower substrate 12, and the panel driving part 20 supplies the signals to the gate and data lines.

The front case 30 covers peripheral regions of the display panel 10 except a display area of the display panel 10. The front case 30 is connected with the pad region of the lower substrate 12, whereby the front case 30 covers the externally-exposed panel driving part 20, and also covers the remaining peripheral regions of the display panel 10.

The front cover 40 is formed to cover the front case 30, that is, the front cover 40 functions as a product case of the display device.

Accordingly, the related art display device necessarily requires the additional structure, that is, front case for covering the externally-exposed panel driving part 20.

Also, the related art display device is provided with the front case 30 and front cover 40 for covering the peripheral regions of the display panel 10, whereby a thickness of the display device is increased and a bezel width is also increased due to the front case 30 and front cover 40 arranged over the edge of the display panel 10.

Furthermore, the front case 30 and front cover 40 for covering the edge of the display panel 10 cause a height difference on a front surface of the display device, thereby deteriorating the exterior appearance of the display device.

SUMMARY

A display device that may include a display panel including a first substrate having a plurality of pad regions, a second substrate confronting with the first substrate and bonded to remaining portions of the first substrate except the plurality of pad regions, and an upper polarizing film attached to an entire upper surface of the second substrate; a panel support member joined to an edge of a lower surface of the display panel; a panel driving part including a flexible circuit film attached to the plurality of pad regions; and a side surface sealing member for covering each side surface of the display panel, the flexible circuit film, the plurality of pad regions, and each side surface of the upper polarizing film.

Also, an inclination surface is formed in each of upper and lower side surfaces of the first and second substrates; one side surface of the upper polarizing film extends to cover the plurality of pad regions, and the remaining side surfaces of the upper polarizing film are not protruding out of the side surface of the second substrate; and the flexible circuit film is bent to have a bent portion for covering the side surface of the first substrate, and is received in the inside of the panel support member.

In another aspect of embodiments of the present invention, there is provided a side surface sealing apparatus for forming a side surface sealing member in each side surface of a display panel including a first substrate having a plurality of pad regions, a second substrate confronting with the first substrate and also being bonded to remaining portions of the first substrate except the plurality of pad regions, and an upper polarizing film attached to an entire upper surface of the second substrate, that may include a stage for supporting the display panel, the stage provided in a base frame; a side surface sealing member forming unit for forming the side surface sealing member in each side surface of the display panel including each side surface of the flexible circuit film and first substrate, each side surface of the second substrate, and each side surface of the upper polarizing film; a Y-axis transfer for transferring the side surface sealing member forming unit in the Y-axis direction; an X-axis transfer for transferring the side surface sealing member forming unit in the X-axis direction; and a control mechanism that controls each of the side surface sealing member forming unit, the Y-axis transfer and the X-axis transfer.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EXEMPLARY EMBODIMENTS

Reference will now be made in detail to the exemplary embodiments of the present invention, examples of which are illustrated in the accompanying drawings. Wherever possible, the same reference numbers will be used throughout the drawings to refer to the same or like parts.

On explanation about the embodiments of the present invention, the following details about the terms should be understood.

The term of a singular expression should be understood to include a multiple expression as well as the singular expression if there is no specific definition in the context. If using the term such as "the first" or "the second", it is to separate any one element from other elements. Thus, a scope of claims is not limited by these terms.

Also, it should be understood that the term such as "include" or "have" does not preclude existence or possibility of one or more features, numbers, steps, operations, elements, parts or their combinations.

It should be understood that the term "at least one" includes all combinations related with any one item. For example, "at least one among a first element, a second element and a third element" may include all combinations of the two or more elements selected from the first, second and third elements as well as each element of the first, second and third elements.

Also, if it is mentioned that a first element is positioned "on or above" a second structure, it should be understood that the first and second elements are brought into contact with each other, or a third element is interposed between the first and second elements.

Hereinafter, embodiments of the present invention will be described in detail with reference to the accompanying drawings.

Figure 1:
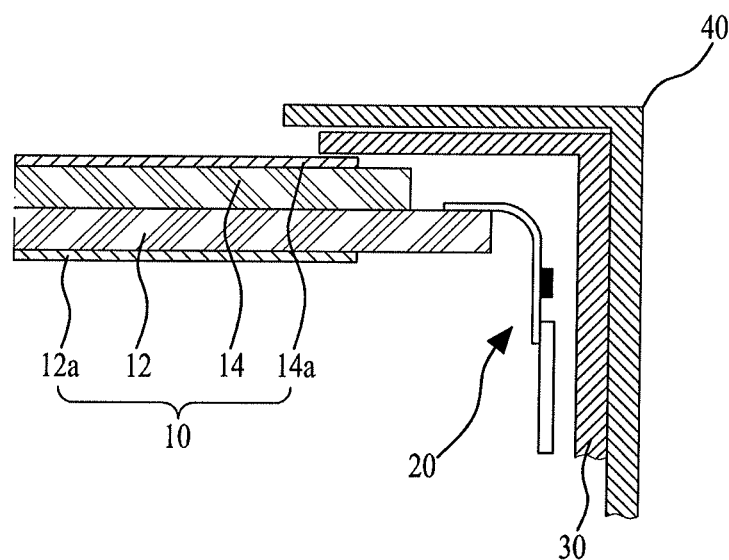
FIG. 1 is a cross sectional view of the related art display device.
Figure 2:
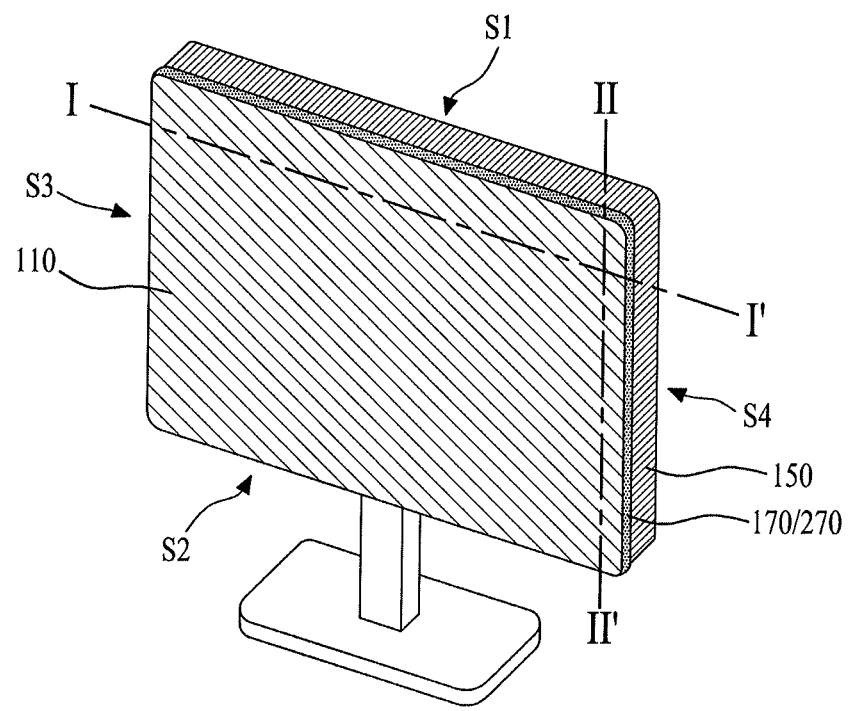
FIG. 2 illustrates a display device according to the first embodiment of the present invention.
Figure 3:
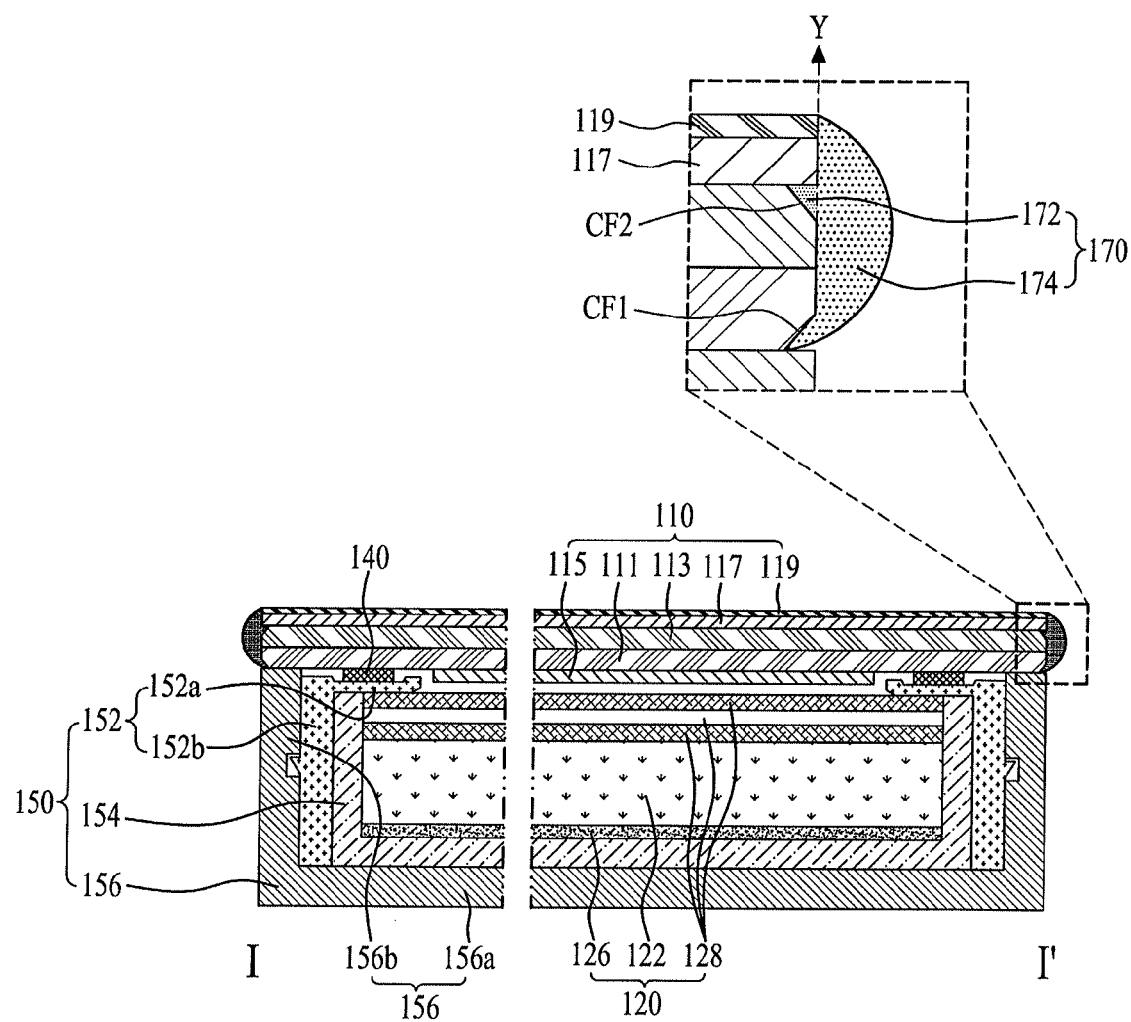
FIG. 3 is a cross sectional view along I-I' of FIG. 2.
Figure 4:
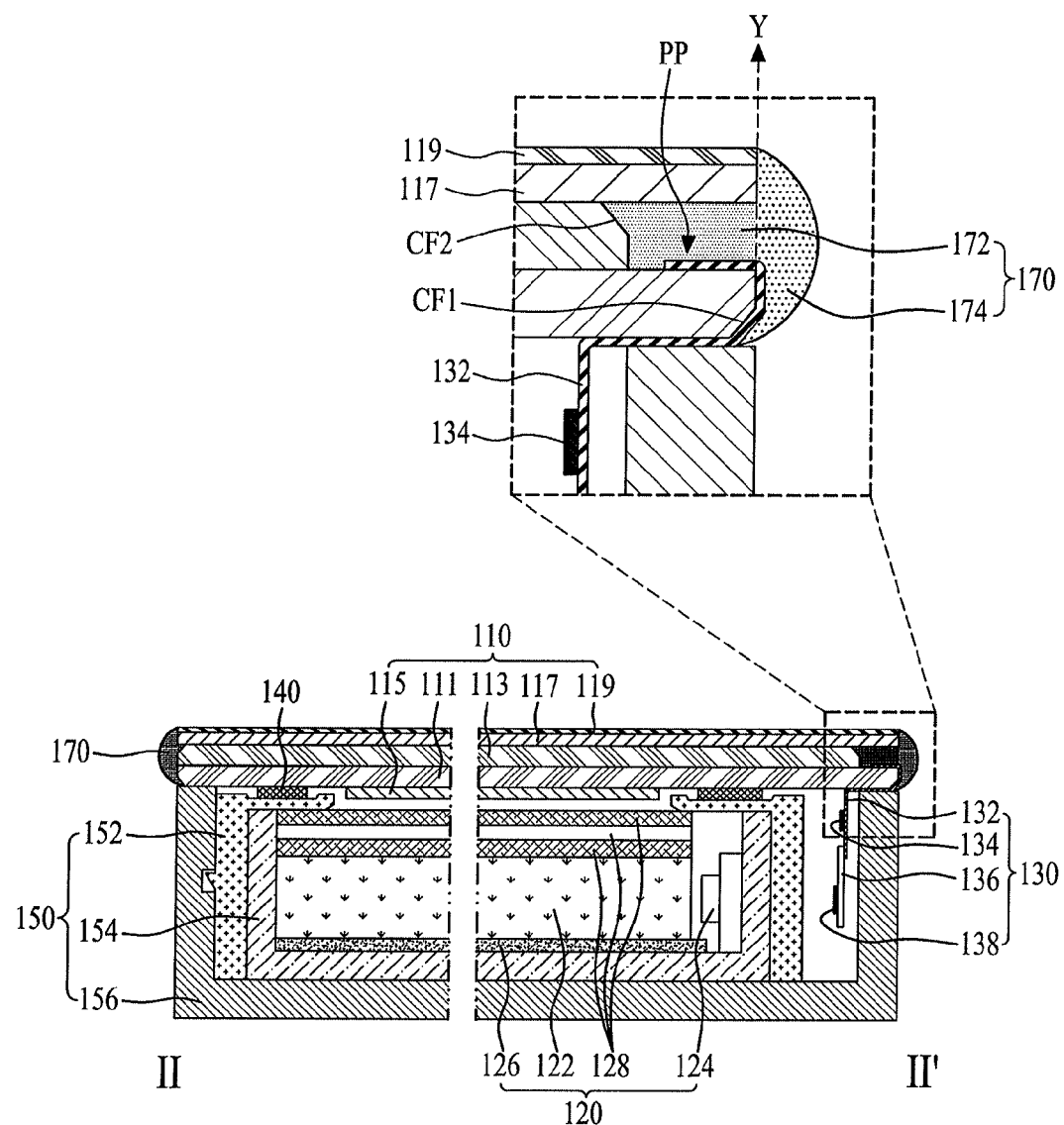
FIG. 4 is a cross sectional view along II-II' of FIG. 4.

FIG. 2 illustrates a display device according to the first embodiment of the present invention. FIG. 3 is a cross sectional view along I-I' of FIG. 2. FIG. 4 is a cross sectional view along II-II' of FIG. 4.

Referring to FIGS. 2 to 4, the display device according to the first embodiment of the present invention may include a display panel 110, a backlight unit 120, a panel driving part 130, a panel joining member 140, a panel support member 150, and a side surface sealing member 170.

The display panel 110 may include first and second substrates 111 and 113 bonded to each other with a liquid crystal layer (not shown) interposed therebetween, a lower polarizing member 115 attached to the first substrate 111, an upper polarizing member 117 attached to the second substrate 113, and a retarder film 119 attached to the upper polarizing member 117.

The first substrate 111 is a thin film transistor array substrate. The first substrate 111 includes a display area and a non-display area. In this case, each corner of the first substrate 111 may have a rounded portion (not shown) which is rounded with a predetermined curvature so as to realize a good external appearance of display device in an aspect of design.

In the display area of the first substrate 111, there are a plurality of pixels (not shown), wherein each pixel is formed every pixel region defined by crossing a plurality of gate lines (no shown) and a plurality of data lines (not shown). Each pixel may include a thin film transistor (not shown) connected with the gate and data lines, a pixel electrode connected with the thin film transistor, and a common electrode formed adjacent to the pixel electrode and supplied with a common voltage. In this case, the common electrode may be formed on the second substrate 113 according to a driving mode of the liquid crystal layer.

In the non-display area of the first substrate 111, there are a plurality of pad regions PP, and a gate driving circuit (not shown).

Each of the pad regions PP is formed in the non-display area of the lower longitudinal side of the first substrate 111, and is also connected with each data line formed in the display area.

The gate driving circuit may be formed during a process of forming the thin film transistor for each pixel. The gate driving circuit is formed in the non-display area at one side or both sides of the first substrate 111, and is also connected with each gate line formed in the display area. In this case, the gate driving circuit is connected with the panel driving part 130 through a plurality of gate pads included in the first and/or last pad region among the plurality of pad regions PP. The gate driving circuit generates a gate (or scan) signal on the basis of gate control signal supplied from the panel driving part 130, and sequentially supplies the generated gate (or scan) signal to each gate line.

The first substrate 111 may have a first inclination surface CF1 which is formed at the lower corner of each side surface S1, S2, S3 and S4 so as to have a predetermined inclination by a chamfer process. The first inclination surface CF1 enables to increase a contact area between the first substrate 111 and the side surface sealing member 170, thereby improving an adhesive strength between the side surface sealing member 170 and the first substrate 111.

The second substrate 113 is a color filter array substrate. The second substrate 113 is formed to include a color filter corresponding to each pixel of the first substrate 111. Under the condition that the liquid crystal layer is interposed between the first substrate 111 and the second substrate 113, the first substrate 111 and the second substrate 113 are bonded to each other. According to the driving mode of the liquid crystal layer, the common electrode supplied with the common voltage may be formed on the second substrate 113.

The second substrate 113 may have a second inclination surface CF2 which is formed at the upper corner of each side surface S1, S2, S3 and S4 so as to have a predetermined inclination by a chamfer process. The second inclination surface CF2 enables to increase a contact area between the second substrate 113 and the side surface sealing member 170, thereby improving an adhesive strength between the side surface sealing member 170 and the second substrate 113. In this case, a distance between the side surface of the second substrate 113 and a point of the second inclination surface CF2 positioned on the upper surface of the second substrate 113 may be set within 0.4 mm~1 mm. If the distance is not less than 1 mm, the side surface sealing member 170 might be visible in the front of the display panel 110 due to the excessive inclination and width of the second inclination surface CF2.

Each corner of the second substrate 113 may have a rounded portion (not shown) which is rounded with a predetermined curvature so as to realize a good external appearance of display device in an aspect of design.

Under the condition that the liquid crystal layer (not shown) is interposed between the first and second substrates 111 and 113, the first and second substrates 111 and 113 are bonded to each other by the use of substrate bonding member (not shown). In this case, the second substrate 113 covers the first substrate 111 except the pad region provided at one edge of the first substrate 111. Accordingly, an electric field corresponding to a differential voltage between the common voltage and a data voltage applied to each pixel may be formed in the first substrate 111 so that it is possible to control light transmittance of the liquid crystal layer by controlling light irradiated from the backlight unit 120. Then, the second substrate 113 filters incident light passing through the liquid crystal layer by the use of color filter, and then emits predetermined color light to the external, whereby a predetermined color image is displayed on the display panel 110. According to the driving mode of the liquid crystal layer, for example, TN (Twisted Nematic) mode, VA (Vertical Alignment) mode, IPS (In-Plane Switching) mode, or FFS (Fringe Field Switching) mode, the structure of the second substrate 113 may be changed in various types generally known to those in the art.

The lower polarizing film 115 is attached to a lower surface of the first substrate 111, wherein the lower polarizing film 115 polarizes the light irradiated onto the display panel 110 from the backlight unit 120.

The upper polarizing film 117 is attached to an upper surface of the second substrate 113, wherein the upper polarizing film 117 polarizes the color light passing through the second substrate 113. In this case, each side surface of the upper polarizing film 117 is cut so that each side surface of the upper polarizing film 117 is not protruding out of the side surface of the first substrate 111. For example, the respective upper side surface S1, the left side surface S3 and the right side surface S4 of the upper polarizing film 117 may be formed at the same lines as the side surfaces of the first and second substrates 111 and 113 along the vertical line Y. Also, the lower side surface S2 of the upper polarizing film 117 extends from the lower side surface S2 of the second substrate 113, thereby covering the plurality of pad regions PP. In this case, both the end of the lower side surface S2 of the upper polarizing film 117 and the end of the lower side surface S2 of the first substrate 111 are positioned at the same vertical line Y. The upper polarizing film 117 whose size is larger than that of the second substrate 113 is attached to the entire area of the second substrate 113 by a film attaching process using a roller, and is then cut by a laser cutting process so that each side surface of the upper polarizing film 117 is not protruding out of the side surface of the first substrate 111.

The retarder film 119 is attached to an entire upper surface of the upper polarizing film 117, wherein the retarder film 119 is identical in size to the upper polarizing film 117. That is, the retarder film 119 whose size is larger than that of the upper polarizing film 117 is attached to the entire surface of the upper polarizing film 117 by a film attaching process using a roller, and is then cut by a laser cutting process so that each side surface of the retarder film 119 is not protruding out of the side surface of the first substrate 111. As described above, the retarder film 119 is attached to the upper surface of the previously-cut upper polarizing film 117, but not necessarily. For example, the upper polarizing film 117 and the retarder film 119 may be sequentially attached to the upper surface of the second substrate 113, and may be simultaneously cut so as not to protrude out of the side surface of the first substrate 111.

The retarder film 119 converts the light passing through the upper polarizing film 117 into 3-dimensional image. The retarder film 119 separates the image to be displayed on the display panel 110 into an image seen by a left eye (hereinafter, referred to as 'left-eye image') and an image seen by a right eye (hereinafter, referred to as 'right-eye image'). To this end, the retarder film 119 may include a plurality of retarder patterns for left-eye image (not shown) overlapped with a left-eye image display region of the display panel for displaying the left-eye image, and a plurality of retarder patterns for right-eye image (not shown) overlapped with a right-eye image display region of the display panel for displaying the right-eye image, wherein each retarder pattern for right-eye image is formed between each of the retarder patterns for left-eye image. The plurality of retarder patterns for left-eye image convert an optical axis of light of the left-eye image passing through the upper polarizing film 117, and the plurality of retarder patterns for right-eye image convert an optical axis of light of the right-eye image passing through the upper polarizing film 117 wherein the optical axis of light of the left-eye image is different from the optical axis of light of the right-eye image. The retarder film 119 converts the image displayed on the display panel 110 into the 3-dimensional image, whereby the display device of the present invention may be a 3-dimensional image display device. If the display device of the present invention is a general 2-dimensional image display device, it is possible to omit the retarder film 119.

The backlight unit 120 is positioned under the display panel 110, and is also held in the inside of the panel support member 150, wherein the backlight unit 120 emits the light to the lower surface of the display panel 110. To this end, the backlight unit 120 may include a light-guiding plate 122, a light source 124, a reflective sheet 126, and an optical member 128.

The light-guiding plate 122 is formed in a plate shape (or wedge shape), and the light-guiding plate 122 guides the incident light, which is emitted from the light source 124 and is incident on an incidence surface, toward the display panel 110. In this case, the light source 124 may include a fluorescent lamp or a light-emitting diode.

The reflective sheet 126 is provided on a rear surface of the light-guiding plate 122, wherein the reflective sheet 126 reflects the incident light, which is guided by the light-guiding plate 122, toward the display panel 110.

The optical member 128 is provided on an upper surface of the light-guiding plate 122, wherein the optical member 128 improves luminance properties of the light traveling toward the display panel 110. To this end, the optical member 128 may include at least one diffusion sheet and at least one prism sheet.

The panel driving part 130 is connected with the plurality of pad regions PP prepared in the first substrate 111 of the display panel 110. The panel driving part 130 displays a predetermined 2-dimensional image or 3-dimensional image on the display panel 110 according to a 2-dimensional display mode or 3-dimensional display mode. To this end, the panel driving part 130 may include a plurality of flexible circuit films 132 respectively attached to the plurality of pad regions PP, a data driving integrated circuit 134 provided in each of the plurality of flexible circuit films 132, a plurality of printed circuit boards 136 respectively attached to the plurality of flexible circuit films 132, and a driving circuit 138 provided in the printed circuit board 136.

The plurality of flexible circuit films 132 are respectively attached to the pad regions PP by TAB (Tape Automated Bonding) process. The plurality of flexible circuit films 132 may be formed of TCP (Tape Carrier Package) or COF (Chip On Film). Each of the flexible circuit films 132 is bent from the pad region PP so as to cover one side surface of the first substrate 111, and is then received in the inside of the panel support member 150.

Each of the data driving integrated circuits 134 is provided in each of the flexible circuit films 132, wherein each of the data driving integrated circuits 134 converts digital input data into a data voltage through the printed circuit board 136, and supplies the data voltage to the corresponding data line through each pad region PP.

The printed circuit board 136 is attached to the other side in each of the plurality of flexible circuit films 132 by TAB (Tape Automated Bonding) process, and is received in the inside of the panel support member 150 due to the flexible circuit films 132 which is bent and received in the inside of the panel support member 150.

The driving circuit 138 is provided in the printed circuit board 136, wherein the driving circuit 138 drives the respective data driving integrated circuit 134 and gate driving circuit. To this end, the driving circuit 138 may include a timing controller (not shown) to control the driving of data driving integrated circuit 134 and gate driving circuit, various power circuits (not shown), and a memory device (not shown).

The panel support member 150, which is joined to a rear edge of the display panel 110 through the panel joining member 140, supports the respective side surfaces and entire upper surface of the display panel 110 under the condition that the respective side surfaces and entire upper surface of the display panel 110 are exposed to the external. The panel support member 150 is connected only with the rear surface of the display panel 110, that is, the remaining portions of the display panel 110 are not connected or covered with the panel support member 150. In other words, only the rear edge of the display panel 110 is placed onto and supported by the panel support member 150. Except the lower surface of the display panel 110, the remaining four side surfaces and upper surface of the display panel 110 are not covered with the panel support member 150, and are exposed to the external. To this end, the panel support member 150 may include a guide frame 152, a receiving case 154, and a support cover 156.

The guide frame 152 is formed in a rectangular frame shape to have "]" shaped cross section. The guide frame 152 is placed in the receiving case 154 and is combined with the support cover 156, and is also joined to the rear edge of the display panel 110 through the panel joining member 140. To this end, the guide frame 152 may include a panel connection part 152*a*, and a guide sidewall 152*b* vertically bent from the panel connection part 152*a* and combined with the support cover 156.

The panel joining member 140 is formed in the panel connection part 152*a* of the guide frame 152, thereby combining the display panel 110 and the guide frame 152 with each other. Preferably, the panel joining member 140 is connected with the first substrate 111 of the display panel 110 in consideration of a connection between the guide frame 152 and the display panel 110 and a thickness thereof, but not necessarily. For example, the panel joining member 140 may be connected with the lower polarizing film 115 of the display panel 110. The panel joining member 140 may be double-sided tape, thermal curing adhesive, or photo curing adhesive.

The receiving case 154, which is formed in "U" shape to include a receiving space, receives (or supports) the backlight unit 120 therein, and also support the guide frame 152. A sidewall of the receiving case 154 supports the panel connection part 152*a* of the guide frame 152, wherein the sidewall of the receiving case 154 is covered by the guide sidewall 152*b* of the guide frame 152. The receiving case 154 may be omitted in consideration of design aspect and slimness.

The support cover 156 receives the receiving case 154 therein, and also supports the rear edge of the display panel 110 to cover the side surface of the guide frame 152. The support cover 156 may be formed of a plastic material or a metal material. In order to realize good external appearance of the manufactured display device 100, it is preferable that the support cover 156 be formed of the metal material. To this end, the support cover 156 may include a cover plate 156*a*, and a cover sidewall 156*b*.

The cover plate 156*a* supports the receiving case 154. The cover plate 156*a* may be a rear cover of the manufactured display device such as television, monitor, or notebook computer.

The cover sidewall 156*b*, which is vertically bent from an edge of the cover plate 156*a*, covers the side surface of the guide frame 152 and the panel driving part 130, and also supports the rear edge of the display panel 110. In this case, the cover sidewall 156*b* and the guide sidewall 152*b* of the guide frame 152 may be coupled with each other by a hook coupling method or a side surface coupling method using a screw. The cover sidewall 156*b* may be a side cover of the manufactured display device.

An upper surface of the cover sidewall 156*b* may be attached to the rear edge of the display panel 110 through an additional adhesive member (not shown).

As described above, the guide frame 152 and the cover sidewall 156b are coupled with each other, but not necessarily. In consideration of the design aspect of the display device 100, the guide frame 152 may be coupled with the receiving case 154. In this case, the support cover 156 may be coupled with a bottom surface of the receiving case 154 by a rear surface coupling method using a screw.

The side surface sealing member 170 covers each side surface of the display panel 110 to be exposed to the external, thereby preventing the upper polarizing film 117 and the retarder film 119 from being separated from the second substrate 113, preventing light leakage in each side surface of the display panel 110, and simultaneously protecting each side surface of the display panel 110 from an external shock. To this end, the side surface sealing member 170 may include a transparent sealing member 172, and an opaque sealing member 174.

The transparent sealing member 172 is charged in a ∠-shaped groove prepared between the second substrate 113 and the upper polarizing film 117 by the second inclination surface CF2 of the second substrate 113, as shown in an expanded part of FIG. 3, and is also charged in a gap between the upper polarizing film 117 and the first substrate 111 with the pad region PP, as shown in an expanded part of FIG. 4. After charging the aforementioned groove and gap with the transparent sealing member 172, the transparent sealing member 172 is immediately cured by heat or photo. Accordingly, the transparent sealing member 172 formed in each of the upper side surface S1, the left side surface S3 and the right side surface S4 of the display panel 110 is adhered to the second inclination surface CF2 and the lower surface of the upper polarizing film 117 for covering the second inclination surface CF2. Also, the transparent sealing member 172 formed in the lower side surface S2 and the pad region PP of the display panel 110 is adhered to the pad region PP of the first substrate 111, the upper surface of each flexible circuit film 132, the side surface of the second substrate 113, the second inclination surface CF2 of the second substrate 113, and the lower surface of the upper polarizing film 117 for covering the pad region PP.

The transparent sealing member 172 may be formed of silicon based or UV-curing based sealant (or resin). In consideration of tack time, it is preferable that the transparent sealing member 172 be formed of the UV-curing based sealant. In this case, the transparent sealing member 172 may be cured by ultraviolet ray (UV) irradiated from the side surface of the display panel 110 and/or ultraviolet ray (UV) irradiated through the retarder film 119 and the upper polarizing film 117.

The opaque sealing member 174 covers the entire side surfaces of the display panel 110 including the transparent sealing member 172, wherein the opaque sealing member 174 is swollen toward the external of the display device. That is, the opaque sealing member 174 covers each side surface of the first substrate 111, the first inclination surface CF1 of the first substrate 111; the bent portion of the flexible circuit film 132, that is, the portion inwardly bent toward the inside of the panel support member 150; the transparent sealing member 172; each side surface of the second substrate 113; each side surface of the upper polarizing film 117; and each side surface of the retarder film 119. Especially, the opaque sealing member 174 is adhered to each side surface of the upper polarizing film 117 and the retarder film 119 so that it is possible to prevent the upper polarizing film 117 and the retarder film 119 from being separated from the second substrate 113, and to prevent a thermal shrinkage of the upper polarizing film 117 and retarder film 119, thereby preventing crosstalk occurring when there is a misalignment between the left-eye and right-eye image display regions and the retarder patterns for left-eye and right-eye images.

The opaque sealing member 174 may be formed of silicon based or UV-curing based sealant (or resin). In consideration of tack time, it is preferable that the opaque sealing member 174 be formed of the UV-curing based sealant. In this case, the opaque sealing member 174 may be colored (for example, blue, green, bluish green, or black), but it is not limited to these colors. In consideration of design aspect of the display device 100, the color of the opaque sealing member 174 may be selected. In order to prevent light from leaking in the side surface of the display panel 110 by an internal total reflection of the first substrate 111, it is preferable that the opaque sealing member 174 be formed of colored resin or light-shielding resin.

In the pad region PP provided with the transparent sealing member 172, there may be a light-absorbing layer (not shown) or reflection preventing layer for preventing the external light from being reflected by the pad. The light-absorbing layer or reflection preventing layer may be formed before the process of forming the transparent sealing member 172.

If the retarder film 119 is removed from the aforementioned display panel 110, the transparent sealing member 172 of the side surface sealing member 170 may be charged in the groove prepared between the upper polarizing film 117 and the second inclination surface CF2 of the second substrate 113, and the gap between the upper polarizing film 117 and the first substrate 111 being overlapped with each other; and the opaque sealing member 174 may cover each side surface and first inclination surface CF 1 of the first substrate 111 including the bent portion of the flexible circuit film 132, the transparent sealing member 172, each side surface of the second substrate 113, and each side surface of the upper polarizing film 117.

In the aforementioned display device according to the first embodiment of the present invention, the front of the display panel is formed in the completely flat surface without any height difference since the entire front surface and each side surface of the display panel 110 are exposed to the external, and a structure (bezel) for forming the front edge of the display panel 110 and front surface portions with height difference are completely removed from the display panel 110, thereby realizing good external appearance of the display device in aspect of design. Especially, there is no structure in the front surface of the display panel 110 of the display device according to the first embodiment of the present invention so that it is possible to heighten user's (or viewer's) immersion in viewing image.

Figure 5:
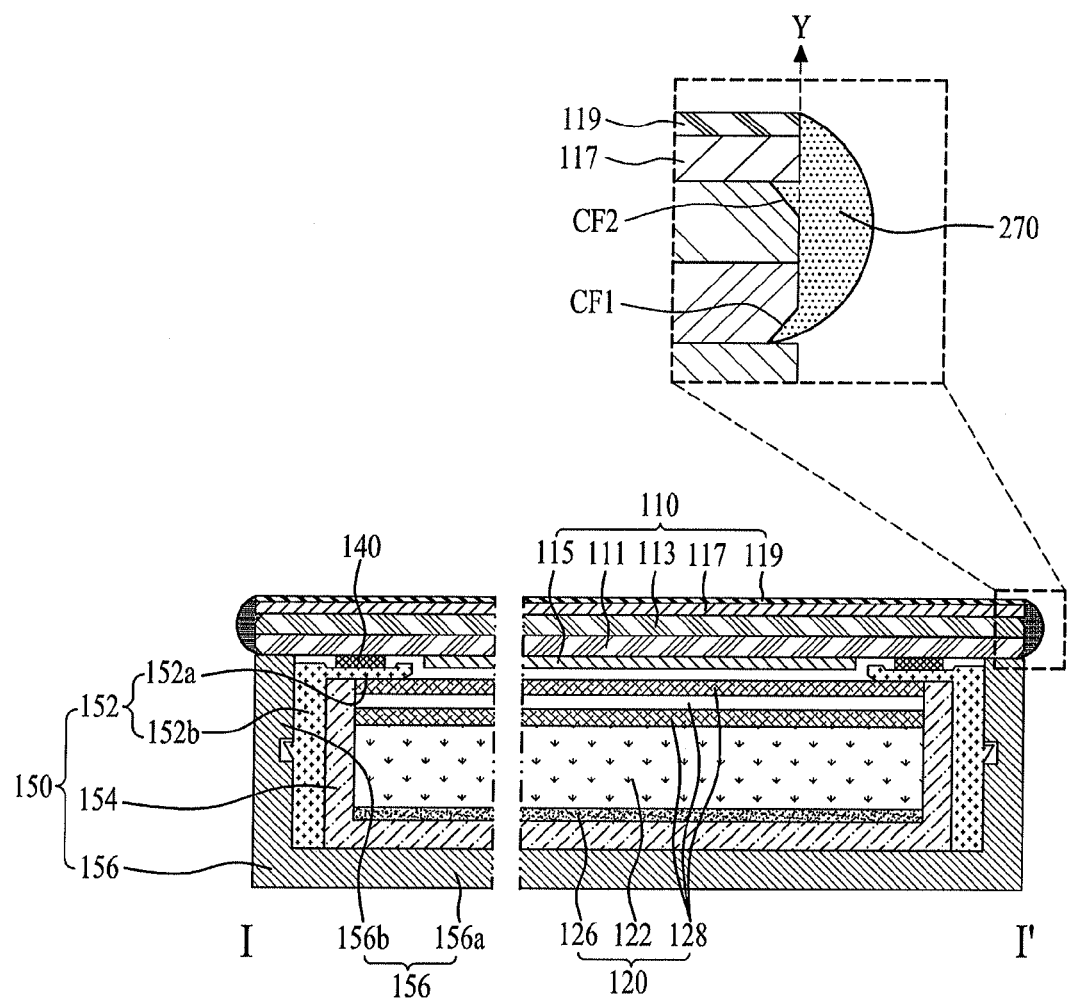
FIG. 5 is a cross sectional view along I-I' of FIG. 2, which illustrates a display device according to the second embodiment of the present invention.
Figure 6:
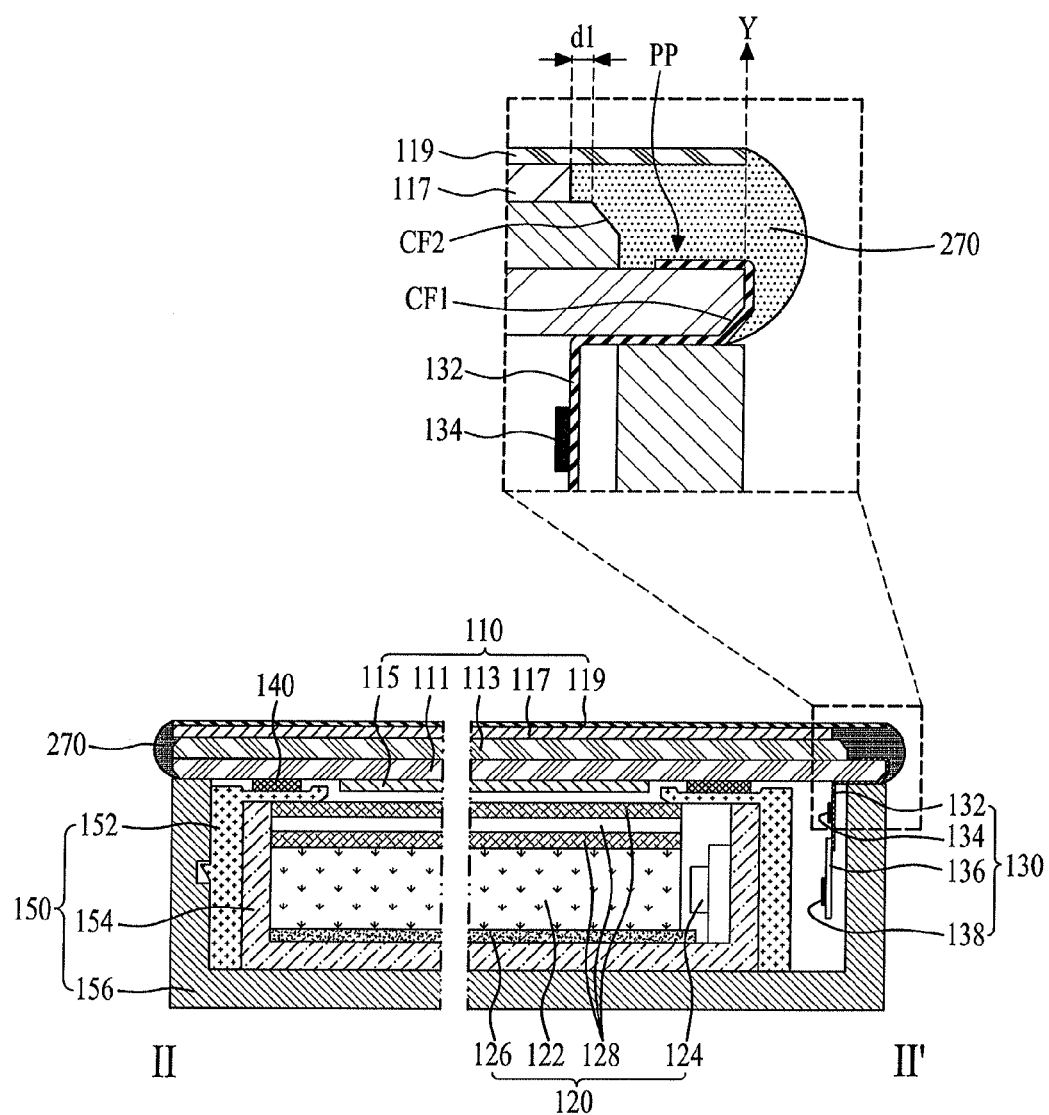
FIG. 6 is a cross sectional view along II-II' of FIG. 2, which illustrates a display device according to the second embodiment of the present invention.

FIG. 5 is a cross sectional view along I-I' of FIG. 2, which illustrates a display device according to the second embodiment of the present invention. FIG. 6 is a cross sectional view along II-II' of FIG. 2, illustrating a display device according to the second embodiment of the present invention, which is obtained by changing a structure of an upper polarizing film 117 and a side surface sealing member 270.

In case of the display device according to the second embodiment of the present invention, the side surface sealing member 270 for covering each side surface of a display panel 110 may be formed one dispensing process and curing process, whereby a process for forming the side surface sealing member 270 may be simplified. Hereinafter, only the upper polarizing film 117 and side surface sealing member 270 will be described in detail as follows.

The upper polarizing film 117 is attached only to an upper surface of a second substrate 113. That is, the upper polarizing film 117 is attached only to the upper surface of the second substrate 113 so that each side surface of the upper polarizing film 117 is not protruding out of each side surface of the second substrate 113. For example, the respective upper side surface, the left side surface and the right side surface of the upper polarizing film 117 are cut to be at the same line as the side surfaces of the second substrate 113 along a vertical line Y. Meanwhile, the lower side surface of the upper polarizing film 117, which is adjacent to a plurality of pad regions PP, is not overlapped with a lower edge of the first substrate 111 provided with the plurality of pad regions PP. Accordingly, the plurality of pad regions PP formed in the first substrate 111 and a second inclination surface CF2 of the second substrate 113 are overlapped and covered by an aforementioned retarder film 119.

The upper polarizing film 117 whose size is larger than that of the second substrate 113 is attached to the entire upper surface of the second substrate 113 by a film attaching process using a roller, and is then cut by a laser cutting process so that each side surface of the upper polarizing film 117 is not protruding out of the side surface of the first substrate 111. If the upper polarizing film 117 is attached to the upper surface of the second substrate 113 so as to be overlapped with the plurality of pad regions PP, the plurality of pad regions PP might be damaged by the laser cutting process. In order to overcome these problems, during the film attaching process using the roller, the upper polarizing film 117 is firstly attached to the lower side surface of the second substrate 113, and is then gradually attached toward the upper side surface of the second substrate 113 so as not to be overlapped with the plurality of pad regions PP. During the laser cutting process, each of the upper side surface, the left side surface and the right side surface of the upper polarizing film 117 whose size is larger than that of the second substrate 113 is cut. A distance 'd1' between an end of the upper polarizing film 117 and the second inclination surface CF2 of the second substrate 113 is generated due to tolerance of the film attaching process using the roller. The distance 'd1' may not occur according to accuracy of a film attaching apparatus.

The side surface sealing member 270 covers each side surface of the display panel 110 to be exposed to the external, thereby preventing the upper polarizing film 117 and the retarder film 119 from being separated from the second substrate 113, preventing light leakage in the side surface of the display panel 110, and simultaneously protecting each side surface of the display panel 110 from an external shock.

The side surface sealing member 270 covers each side surface of the display panel 110 which includes a ∠-shaped groove prepared between the second inclination surface CF2 of the second substrate 113 and the upper polarizing film 117 of the second substrate 113, as shown in an expanded part of FIG. 5, and also includes a gap between the upper polarizing film 117 and the first substrate 111 with the pad region PP, as shown in an expanded part of FIG. 6. A material for the side surface sealing member 270 may be the same as a material for an opaque sealing member 174 shown in FIG. 4.

The side surface sealing member 270 for covering each of the upper side surface S1, the left side surface S3 and the right side surface S4 of the display panel 110 is attached to the first inclination surface CF1 and the side surface of the first substrate 111, the second inclination surface CF2, and the lower edge of the upper polarizing film 117 for covering the second inclination surface CF2. The side surface sealing member 270 for covering each of the upper side surface S1, the left side surface S3 and the right side surface S4 of the display panel 110 may be cured by ultraviolet ray (UV) irradiated from the side surface of the display panel 110 and/or ultraviolet ray (UV) irradiated through the retarder film 119 and the upper polarizing film 117.

The side surface sealing member 270 for covering the lower side surface S2 of the display panel 110 is adhered to the side surface of the substrate 111; the first inclination surface CF1 of the first substrate 111; the bent portion of the flexible circuit film 132, that is, the portion inwardly bent toward the inside of the panel support member 150; the pad region PP of the first substrate 111; the upper surface of each flexible circuit film 132; the lower side surface of the second substrate 113; the second inclination surface CF2 of the second substrate 113; the upper edge in the lower side surface of the second substrate 113; the lower side surface of the upper polarizing film 117; and the lower edge and lower side surface of the retarder film 119 for covering the pad region PP. The side surface sealing member 270 for covering the lower side surface of the display panel 110 may be cured by ultraviolet ray (UV) irradiated from the side surface of the display panel 110 and/or ultraviolet ray (UV) irradiated through the retarder film 119. In this case, the ultraviolet ray (UV) curing the side surface sealing member 270 for covering the lower side surface of the display panel 110 passes only through the retarder film 119, whereby its transmittance is higher than that of the aforementioned first embodiment of the present invention.

Accordingly, the display device according to the second embodiment of the present invention provides the same effect as that of the display device according to the first embodiment of the present invention, and also enables to simplify the process of forming the side surface sealing member 270.

Figure 7:
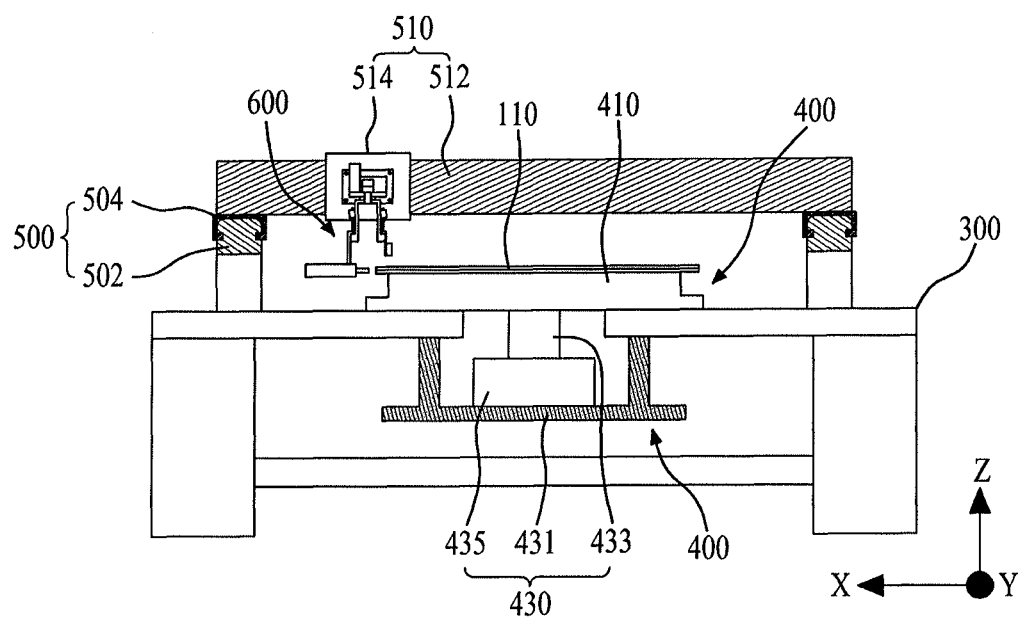
FIG. 7 illustrates a side surface sealing apparatus for display panel according to the embodiment of the present invention.
Figure 8:
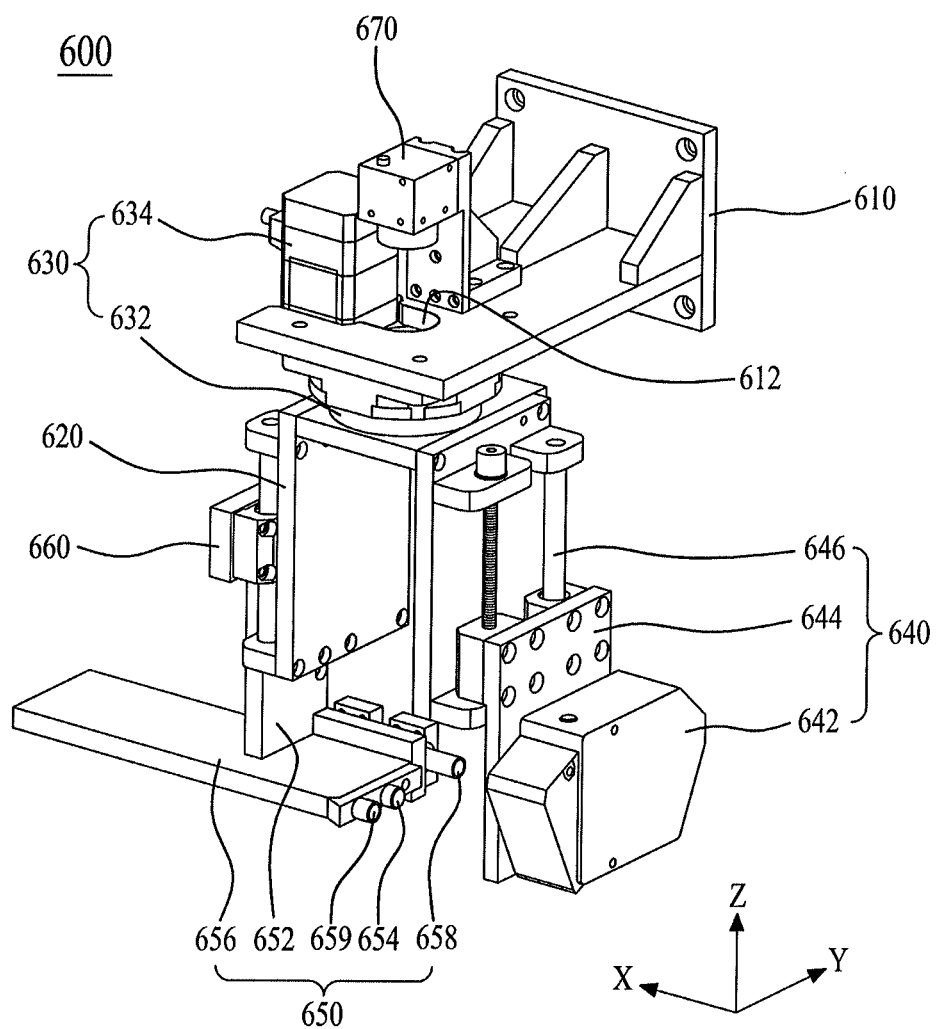
FIG. 8 illustrates a side surface sealing member forming unit shown in FIG. 7.
Figure 9:
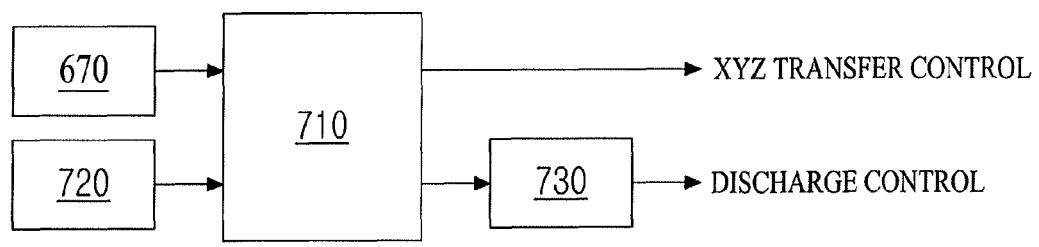
FIG. 9 is a block diagram showing a control mechanism to control the side surface sealing apparatus shown in FIG. 7.

FIG. 7 illustrates a side surface sealing apparatus for display panel according to the embodiment of the present invention. FIG. 8 illustrates a side surface sealing member forming unit shown in FIG. 7. FIG. 9 is a block diagram showing a control mechanism to control the side surface sealing apparatus shown in FIG. 7.

Referring to FIGS. 7 to 9, the side surface sealing apparatus for display panel according to the embodiment of the present invention may include a base frame 300, a stage 400, a Y-axis transfer 500, an X-axis transfer 510, a side surface sealing member forming unit 600, and a control mechanism 700.

The base frame 300 may include a flat-type base plate, and a plurality of supporters for supporting the base plate. On the base frame 300, there is a panel alignment unit (not shown) for aligning the display panel 110 placed onto a work table 410.

The stage 400 is movably provided in the base frame 300, wherein the stage 400 supports the display panel 110 loaded by a panel loading apparatus (not shown). In this case, the display panel 110 may be the aforementioned display panel 110 shown in FIGS. 3 to 6, and the flexible circuit film 132 of the panel driving part 130 is attached to the plurality of pad regions PP formed in the display panel 110. The flexible circuit film 132 is bent along the side surface of the first substrate 111, and is fixed to the lower surface of the first substrate 111.

The stage 400 may include the work table 410, and a table elevating unit 430.

The work table 410 is provided on the base plate of the base frame 300, and is supported by the table elevating unit 430, to thereby support the lower surface of the display panel 110. In this case, the work table 410 is provided with a protruding portion having a predetermined height. Also, the work table 410 is provided with a plurality of lift pins (not shown) which temporarily supports the loaded display panel 110, and places the supported display panel 110 onto the upper surface of the protruding portion. The protruding portion may be provided with a plurality of vacuum holes (not shown) for stably holding the display panel 110 through the use of vacuum force.

The table elevating unit 430 is provided below the base plate of the base frame 300, wherein the work table 410 is movably supported by the table elevating unit 430. The table elevating unit 430 may elevate (or lower) the work table 410 to a panel loading position when the display panel 110 is loaded, and lower (or elevate) the work table 410 to a side surface sealing member dispensing position when the display panel 110 is loaded onto the work table 410. To this end, the table elevating unit 430 may include a shelf 431, a supporting axis 433, and an elevating driver 435.

The shelf 431, which is provided at a predetermined interval from a rear surface of the base plate, supports the elevating driver 435. The supporting axis 433 penetrating through the base plate is connected with a rear surface of the work table 410. The elevating driver 435 is provided in the shelf 435 and is connected with the supporting axis 433, whereby the elevating driver 435 elevates the supporting axis 433, to thereby elevate the work table 410.

The Y-axis transfer 500 may include one pair of Y-axis transfer guides 502 provided in parallel above the base frame 300 under the condition that the work table 410 is positioned in-between, one pair of Y-axis transfer blocks 504 movably combined with the pair of Y-axis transfer guides 502, and a Y-axis driver (not shown) enabling a reciprocating motion of the pair of Y-axis transfer blocks 504 in the Y-axis direction. The Y-axis transfer 500 reciprocally transfers the side surface sealing member forming unit 600 in the Y-axis direction.

The X-axis transfer 510 is provided in the Y-axis transfer 400 so as to traverse across the work table 410, wherein the X-axis transfer 510 supports the side surface sealing member forming unit 600, and transfers the side surface sealing member forming unit 600 in the X-axis direction. To this end, the X-axis transfer 510 may include an X-axis transfer guide 512 provided between each of the Y-axis transfer blocks 504 constituting one pair in the Y-axis transfer 500, an X-axis transfer block 514 movably combined with the X-axis transfer guide 512, and an X-axis driver (not shown) enabling a reciprocating motion of the pair of X-axis transfer blocks 514 in the X-axis direction.

The side surface sealing member forming unit 600 is movably provided in the X-axis transfer 510, that is, X-axis transfer block 514. While the side surface sealing member forming unit 600 moves in the X-axis and Y-axis directions by the use of X-axis transfer 510 and Y-axis transfer 500, the side surface sealing member forming unit 600 forms the aforementioned sealant along each side surface of the display panel 110 placed onto the work table 410, and immediately cures the dispensed sealant, thereby forming the sealing members 170 and 270 for covering each side surface of the display panel 110. To this end, the side surface sealing member forming unit 600 according to one embodiment of the present invention may include a support bracket 610, a rotation bracket 620, a rotation mechanism 630, a panel position detecting mechanism 640, a nozzle 650, an elevating mechanism 660, and an interval photographing camera 670.

The support bracket 610 is formed in shape of "L", and is provided in the X-axis transfer block 514. The support bracket 610 is transferred in the XY axis direction according to the transfer of the Y-axis transfer block 504 and the X-axis transfer block 514. The support bracket 610 is provided with a first opening 612 overlapped with the display panel 110 to be dispensed with the sealant.

The rotation bracket 620 is formed in shape of "∩", and is rotatably provided below the support bracket 610. The rotation bracket 620 supports the panel position detecting mechanism 640, the nozzle 650 and the elevating mechanism 660. An upper surface of the rotation bracket 620 is provided with a second opening overlapped with the first opening 612.

The rotation mechanism 630, which is provided in the support bracket 610, rotates the rotation bracket 620. To this end, the rotation mechanism 630 may include a head rotation axis 632 having a hollow being communicated with the first opening 612 and the second opening so as to support the rotation bracket 620; and a rotation motor 634 for rotating the head rotation axis 632, wherein the rotation motor 634 is provided at one side of the upper surface of the support bracket 610.

The panel position detecting mechanism 640 may include a module elevator 642 provided at one side surface of the rotation bracket 620; a module support frame 644 provided in the module elevator 642; and a position detecting member 646 provided in the module support frame 644, wherein the position detecting member 646 detects a position of the edge of the display panel 110. The panel position detecting mechanism 640 detects the position of the edge of the display panel 110 placed onto the work table 510 through the position detecting member 646, and provides information about the panel position to a real-time controller (not shown).

The nozzle 650 is provided at one side surface of the rotation bracket 620. The nozzle 650 dispenses the sealant on the side surface of the display panel 110 placed onto the work table 410, and immediately cures the dispensed sealant, to thereby form the aforementioned side surface sealing members 170 and 270. To this end, the nozzle 650 may include a head support frame 652, a sealant dispensing nozzle 654, a sealant supply module 656, and a sealant curing nozzle 658.

The head support frame 652, which is vertically provided at one side surface of the rotation bracket 620, supports the sealant dispensing nozzle 654, the sealant supply module 656, and the sealant curing nozzle 658.

The sealant dispensing nozzle 654 is arranged to confront with the side surface of the display panel 110, wherein the sealant dispensing nozzle 654 dispenses the sealant supplied from the sealant supply module 656 onto the side surface of the display panel 110.

The sealant supply module 656 supplies the stored sealant to the sealant dispensing nozzle 654 in response to a sealant spraying control signal supplied from the real-time controller, whereby a predetermined amount of the sealant is dispensed onto the side surface of the display panel 110.

The sealant curing nozzle 658 is arranged at a rear end of the sealant dispensing nozzle 654. The sealant curing nozzle 658 cures the sealant dispensed onto the side surface of the display panel 110 by the sealant dispensing nozzle 654, to thereby form the side surface sealing members 170 and 270 on the side surface of the display panel 110. For example, the sealant curing nozzle 658 may irradiate the sealant dispensed onto the side surface of the display panel 110 with ultraviolet ray (UV).

In FIG. 8, the nozzle 650 includes one sealant dispensing nozzle 654 and one sealant curing nozzle 658, but it is not limited to this structure. As shown in FIGS. 3 and 4, in order to form the side surface sealing member 170, the nozzle 650 may include a transparent sealing member dispensing nozzle for dispensing a transparent sealing member, a transparent sealing member curing nozzle for curing the transparent sealing member, an opaque sealing member dispensing nozzle for dispensing an opaque sealing member, an opaque sealing member curing nozzle for curing the opaque sealing member, a transparent sealing member supply module, and an opaque sealing member supply module. In the nozzle 650, there are the transparent sealing member dispensing nozzle, the transparent sealing member curing nozzle, the opaque sealing member dispensing nozzle and the opaque sealing member curing nozzle arranged in sequence.

Meanwhile, the nozzle 650 may further include a cleaning nozzle 659 provided in a front end of the sealant dispensing nozzle 654. The cleaning nozzle 659 sprays cleaning gas such as nitrogen gas or atmospheric pressure plasma to a sealant dispensing region to be dispensed with the sealant, to thereby clean the sealant dispensing region.

The elevating mechanism 660 is provided at one side surface of the rotation bracket 620, wherein the elevating mechanism 660 elevates the head support frame 652, and adjusts the position of the sealant dispensing nozzle 654 and sealant curing nozzle 658.

The interval photographing camera 670 is provided in the support bracket 610, and is overlapped with the first opening 612, the second opening and the hollow of the head rotation axis 632. The interval photographing camera 670 photographs the interval between the side surface of the display panel 110 and the sealant dispensing nozzle 654 through the first opening 612, the second opening and the hollow of the head rotation axis 632, and then provides the photographed image to the real-time controller. The interval photographing camera 670 may be CCD (Charge Coupled Device) camera.

The control mechanism 700 may include the real-time controller 710, a transfer trace setting unit 720, and a discharge controller 730. The control mechanism 700 transfers and rotates the aforementioned nozzle 650 in the X-axis, Y-axis and Z-axis directions.

The real-time controller 710 totally controls operations for forming the side surface sealing members 170 and 270 in each side surface of the display panel 110 according to the process of forming the predetermined side surface sealing member.

The real-time controller 710 controls each of the aforementioned Y-axis transfer 500, the X-axis transfer 510, the elevating mechanism 660, and the rotation mechanism 630 according to the processing flow of forming the side surface sealing member, wherein the processing flow is preset in the transfer trace setting unit 720, to thereby transfer and rotate the nozzle 650 in the X-axis, Y-axis and Z-axis directions.

The real-time controller 710 analyzes the photographed image which is provided from the aforementioned interval photographing camera 670, and constantly maintains the interval between the side surface of the display panel 110 and the sealant dispensing nozzle 654, thereby preventing a collision between the sealant dispensing nozzle 654 and the display panel 110 when the sealant dispensing nozzle 654 is transferred.

The real-time controller 710 sets information about sealant dispensing amount of the sealant dispensing nozzle 654 on the basis of panel position information provided from the aforementioned panel position detecting mechanism 640, provides the set information to the discharge controller 730, and controls a transfer speed of the nozzle 650 on the basis of panel position information. In this case, if the nozzle 650 is positioned at the side surface of the display panel 110, the real-time controller 710 makes the nozzle 650 be transferred at a uniform velocity. Meanwhile, if the nozzle 650 is positioned at each corner of the display panel 110, the real-time controller 710 rotates the nozzle 650, and controls the sealant dispensing amount so as to prevent a lump of sealant.

The discharge controller 730 controls a discharging amount of the sealant to be discharged from the sealant dispensing nozzle 654 of the nozzle 650 on the basis of sealant dispensing amount information provided from the real-time controller 710, to thereby form the side surface sealing members 170 and 270 in each side surface of the display panel 110.

Figure 10:
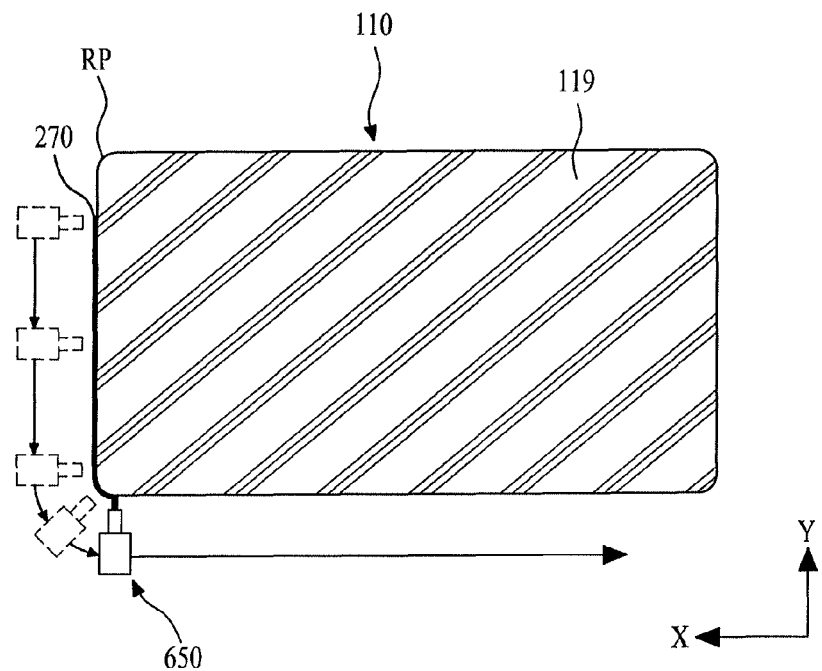
FIG. 10 is a concept view illustrating a process of forming a side surface sealing member through the use of side surface sealing apparatus for display panel according to the embodiment of the present invention.

FIG. 10 is a concept view illustrating the process of forming the side surface sealing member through the use of side surface sealing apparatus for display panel according to the embodiment of the present invention.

Hereinafter, a method of forming the side surface sealing member 270 shown in FIGS. 5 and 6 will be described with reference to FIGS. 7 to 10.

First, when the display panel 110 with the aforementioned upper polarizing film 117 and retarder film 119 attached thereto is placed onto the work table 410, the position of the display panel 110 is aligned.

Then, the real-time controller 710 initially drives each of the aforementioned Y-axis transfer 500 and the X-axis transfer 510 on the base of panel position information provided from the aforementioned panel position detecting mechanism 640, whereby the sealant dispensing nozzle 654 is positioned at the initial position preset in one side surface of the display panel 110. Thereafter, the real-time controller 710 analyzes the photographed image provided from the interval photographing camera 670, and initially drives each of the Y-axis transfer 500 and X-axis transfer 510 on the basis of analyzed information, thereby setting the interval between the side surface of the display panel 110 and the sealant dispensing nozzle 654.

According to the control of each of the real-time controller 710 and the discharge controller 730, the nozzle 650 is transferred at the uniform velocity in the X-axis direction, the sealant provided from the sealant dispensing nozzle 654 is dispensed onto one side surface of the display panel 110, and the ultraviolet ray (UV) is irradiated onto the dispensed sealant from the sealant curing nozzle 658. Accordingly, the sealant dispensed onto one surface of the display panel 110 through the sealant dispensing nozzle 654 is cured by the ultraviolet ray (UV), whereby the side surface sealing member 270 is formed by the cured sealant in one surface of the display panel 110 while the nozzle 650 passes therealong.

If the sealant dispensing nozzle 654 is transferred to one corner of the display panel 110, the real-time controller 710 controls each driving of the Y-axis driver 500, the X-axis transfer 510 and the rotation mechanism 630 so that the nozzle 650 is rotated along the curvature of the rounded portion (RP) at one corner of the display panel 110. Also, the real-time controller 710 controls the sealant dispensing amount to be dispensed onto the rounded portion (RP) of the display panel 110 through the use of discharge controller 730. As mentioned above, the nozzle 650 is transferred at the uniform velocity by the real-time controller 710. Thus, if the nozzle 650 is rotated at the uniform velocity along the rounded portion (RP) of the display panel 110, the lump of sealant might occur. In order to prevent the lump of sealant in the rounded portion (RP), the real-time controller 710 controls the sealant dispensing amount to be dispensed onto the rounded portion (RP) through the use of discharge controller 730.

While the nozzle 650 is transferred at the uniform velocity, the discharging amount of the sealant to be discharged from the sealant dispensing nozzle 654 is controller so that the side surface sealing member 270 is continuously formed in each side surface and the rounded portion (RP) of the display panel 110.

The process of forming the side surface sealing member shown in FIGS. 3 and 4 through the use of side surface sealing apparatus for display panel according to the embodiment of the present invention is identical to the aforementioned process except that it uses the transparent sealing member dispensing nozzle, the transparent sealing member curing nozzle, the opaque sealing member dispensing nozzle and the opaque sealing member curing nozzle arranged in the nozzle 650. That is, after the display panel 110 is placed and aligned onto the work table 410, as mentioned above, the transparent sealing member 172 is dispensed onto the side surface of the display panel 110 through the transparent sealing member dispensing nozzle while the nozzle 650 is transferred along the side surface of the display panel 110, and then the dispensed sealant is immediately cured by the ultraviolet ray (UV) irradiated from the transparent sealing member curing nozzle. Also, the opaque sealing member 174 is dispensed onto the side surface of the display panel 110 including the cured transparent sealing member 172 through the opaque sealing member dispensing nozzle, and is immediately cured by the ultraviolet ray (UV) irradiated from the opaque sealing member curing nozzle. Accordingly, it is possible to continuously form the side surface sealing member 170 in each side surface and the rounded portion (RP) of the display panel 110.

As mentioned above, the side surface sealing apparatus for display panel according to the embodiment of the present invention forms the side surface sealing members 170 and 270 in each side surface of the display panel 110, thereby preventing the damage of display panel 110 exposed to the external, the separation of upper polarizing film 117 and retarder film 119, the permeation of moisture, and the side-surface light leakage. Furthermore, the side surface sealing apparatus for display panel according to the embodiment of the present invention uses 4-axis motion control method so that the side surface sealing members 170 and 270 are continuously formed in each side surface of the display panel 110, to thereby decrease a process time for forming the side surface sealing member, and thus improve the yield.

The above display device and the side surface sealing apparatus for display panel according to the embodiments of the present invention are mainly targeted at a liquid crystal display device, but not necessarily. For example, the display device and the side surface sealing apparatus for display panel according to the embodiments of the present invention may be used for various flat display devices, for example, organic light emitting display device. In case of the display device for the organic light emitting display device, an organic light emitting device may be formed on a first substrate, and the organic light emitting device may be driven through a panel driving part connected with the first substrate, whereby an image may be displayed through the use of light emitted to the external through the first or second substrate.

Meanwhile, the display device according to the embodiment of the present invention may be used not only for the display device of television (or monitor) but also for the display device of notebook computer, tablet computer or various mobile information devices.

Accordingly, in the display device and the apparatus for side surface sealing of the display panel according to the embodiment of the present invention, the front surface of the display panel is formed in the completely flat surface without any height difference since the entire front surface and each side surface of the display panel 110 are exposed to the external, thereby realizing good external appearance of the display device in aspect of design.

Also, there is no structure in the front surface of the display panel 110 of the display device according to the embodiment of the present invention so that it is possible to heighten user's (or viewer's) immersion in viewing image.

It will be apparent to those skilled in the art that various modifications and variations can be made to embodiments of the present invention without departing from the spirit or scope of the invention. Thus, it is intended that the present invention covers the modifications and variations of this invention provided they come within the scope of the appended claims and their equivalents.

What is claimed is:

1. A display device comprising:
    a display panel including a first substrate having a plurality of pad regions, a second substrate confronting with the first substrate and bonded to remaining portions of the first substrate except the plurality of pad regions, and an upper polarizing film attached to an entire upper surface of the second substrate;
    a panel support member joined to an edge of a lower surface of the display panel;
    a panel driving part including a flexible circuit film, wherein the flexible circuit film has a portion disposed outside the panel support member and the flexible circuit film is attached to the plurality of pad regions; and
    a side surface sealing member covering each side surface of the display panel, the portion of the flexible circuit film, the plurality of pad regions, and each side surface of the upper polarizing film, no portion of the flexible circuit film being exposed to an outside of the display device.

2. The display device of claim 1, wherein:
    an inclination surface is disposed in each of upper and lower side surfaces of the first and second substrates,
    one side surface of the upper polarizing film extends to cover the plurality of pad regions, and the remaining side surfaces of the upper polarizing film are not protruding out of the side surface of the second substrate, and
    the flexible circuit film is bent to have a bent portion for covering the side surface of the first substrate, and is received in the inside of the panel support member.

3. The display device of claim 2, wherein the side surface sealing member includes:
    a transparent sealing member covering a groove provided between the upper polarizing film and the inclination surface of the second substrate, and a gap provided between the upper polarizing film and the first substrate; and
    an opaque sealing member covering each side surface and the inclination surface of the first substrate including the bent portion of the flexible circuit film, the transparent sealing member, each side surface of the second substrate, and each side surface of the upper polarizing film.

4. The display device of claim 3, wherein the display panel further includes a retarder film attached to an entire upper surface of the upper polarizing film, and the side surface sealing member covers each side surface of the retarder film.

5. The display device of claim 2, wherein the side surface sealing member covers each side surface and the inclination surface of the first substrate including the bent portion of the flexible circuit film, a groove between the upper polarizing film and the inclination surface of the second substrate, a gap between the upper polarizing film and the first substrate, each side surface of the second substrate, and each side surface of the upper polarizing film.

6. The display device of claim 5, wherein the display panel further includes a retarder film attached to an entire upper surface of the upper polarizing film, and the side surface sealing member covers each side surface of the retarder film.

7. The display device of claim 1,
wherein the display panel further includes a retarder film attached to an entire upper surface of the upper polarizing film so as to cover the plurality of pad regions,
an inclination surface is disposed in each of upper and lower side surfaces of the first and second substrates, and each side surface of the upper polarizing film does not protrude out of the side surface of the second substrate, and
the flexible circuit film is bent to have a bent portion covering the side surface of the first substrate, and is received in the inside of the panel support member.

8. The display device of claim 7, wherein the side surface sealing member covers each side surface and the inclination surface of the first substrate including the bent portion of the flexible circuit film, a groove provided between the upper polarizing film and the inclination surface of the second substrate, a gap provided between the upper polarizing film and the first substrate, each side surface of the second substrate, and each side surface of the retarder film.

9. The display device of claim 1, wherein the flexible circuit film includes a first portion disposed inside the panel support member, a second portion disposed on a side surface of the first substrate, and a third portion attached to the pad regions, wherein the side surface sealing member covers the second and third portions of the flexible circuit film.

10. The display device of claim 9, wherein the second portion of the flexible circuit film contacts both the side surface and a lower surface of the first substrate.

* * * * *